(12) United States Patent
Zhou et al.

(10) Patent No.: US 10,545,919 B2
(45) Date of Patent: Jan. 28, 2020

(54) DECOMPOSITION TECHNIQUES FOR MULTI-DIMENSIONAL DATA

(71) Applicant: Google Inc., Mountain View, CA (US)

(72) Inventors: Shuchang Zhou, Beijing (CN); Liyong Chen, Beijing (CN)

(73) Assignee: Google LLC, Mountain View, CA (US)

( * ) Notice: Subject to any disclaimer, the term of this patent is extended or adjusted under 35 U.S.C. 154(b) by 434 days.

(21) Appl. No.: 15/023,226

(22) PCT Filed: Sep. 27, 2013

(86) PCT No.: PCT/CN2013/084457
§ 371 (c)(1),
(2) Date: Mar. 18, 2016

(87) PCT Pub. No.: WO2015/042873
PCT Pub. Date: Apr. 2, 2015

(65) Prior Publication Data
US 2016/0232175 A1    Aug. 11, 2016

(51) Int. Cl.
*G06F 16/174*      (2019.01)
*G06F 16/28*      (2019.01)
(Continued)

(52) U.S. Cl.
CPC ........ *G06F 16/1744* (2019.01); *G06F 16/283* (2019.01); *G06T 1/20* (2013.01);
(Continued)

(58) Field of Classification Search
CPC ........ G06F 17/10; G06F 17/18; G06F 17/153; G06F 16/1744; G06F 16/283;
(Continued)

(56) References Cited

U.S. PATENT DOCUMENTS 8,688,616 B2 *   4/2014   Fernandez Martinez ....................
                                                       G06N 7/005
                                                          706/52
8,989,465 B2 *   3/2015   Trzasko ................ G06T 11/003
                                                             382/128
(Continued)

FOREIGN PATENT DOCUMENTS

CN          102789499 A      11/2012
JP          2009053933 A      3/2009

OTHER PUBLICATIONS

Faroogh Tavakoli; "Parallel sparse matrix-vector nnulitplication"; Uppsala Universityl 1997 (Year: 1997).*
(Continued)

*Primary Examiner* — Dennis Truong
(74) *Attorney, Agent, or Firm* — Lerner, David, Littenberg, Krumholz & Mentlik, LLP

(57) ABSTRACT

Original data that represents a real-world object or activity and organized along three or more dimensions is received. The original data is represented as a product of several multipliers including a sparse core, such that the sparse core has fewer non-zero values than a tensor representation of the original data, and one or more unitary matrix multipliers. Modified data is generated based on the original data using the multipliers. This includes compressing, or reconstructing missing elements in, the tensor representation of the original data, such that the modified data provides a description of the real-world object or activity that is less complete or more complete, respectively, relative to the original data.

20 Claims, 3 Drawing Sheets

(51) Int. Cl.
*G06F 17/16* (2006.01)
*G06F 17/18* (2006.01)
*H03M 7/30* (2006.01)
*G06T 1/20* (2006.01)
*G06T 5/00* (2006.01)

(52) U.S. Cl.
CPC .............. *G06T 5/005* (2013.01); *G06F 17/16* (2013.01); *G06F 17/18* (2013.01); *G06T 2207/10024* (2013.01); *H03M 7/3059* (2013.01)

(58) Field of Classification Search
CPC ......... G06N 7/005; G06T 3/4053; G06T 1/20; G06T 5/005; G06T 2207/10024; H03M 7/3059; H03M 7/30
USPC ......... 385/159; 703/2; 706/46; 707/E17.075, 707/E17.108
See application file for complete search history.

(56) References Cited

U.S. PATENT DOCUMENTS

| | | | | |
|---|---|---|---|---|
| 9,659,145 | B2* | 5/2017 | Sayood | G16B 40/00 |
| 2003/0113024 | A1* | 6/2003 | Feria | G06F 17/147 |
| | | | | 382/238 |
| 2004/0260522 | A1* | 12/2004 | Albera | G06F 17/12 |
| | | | | 702/189 |
| 2007/0055646 | A1* | 3/2007 | Zeng | G06F 17/30675 |
| 2010/0169062 | A1* | 7/2010 | Linn | B29C 45/7693 |
| | | | | 703/2 |
| 2011/0208444 | A1* | 8/2011 | Solinsky | A61B 5/112 |
| | | | | 702/41 |
| 2012/0134579 | A1* | 5/2012 | Kameyama | G06T 3/4053 |
| | | | | 382/159 |
| 2012/0281019 | A1* | 11/2012 | Tamstorf | G06T 3/0093 |
| | | | | 345/646 |
| 2013/0185033 | A1* | 7/2013 | Tompkins | G01V 11/00 |
| | | | | 703/2 |
| 2013/0325781 | A1* | 12/2013 | Bouchard | G06Q 50/01 |
| | | | | 706/46 |
| 2014/0121985 | A1* | 5/2014 | Sayood | G16B 40/00 |
| | | | | 702/19 |
| 2014/0156231 | A1* | 6/2014 | Guo | G06F 17/18 |
| | | | | 703/2 |
| 2016/0005183 | A1* | 1/2016 | Thiagarajan | A61B 5/055 |
| | | | | 382/131 |

OTHER PUBLICATIONS

Lawlor; "In-memory Data Compression for Sparse Matices" University of Alaska Fairbanks (Year: 2013).*
International Search Report and Written Opinion for Application No. PCT/CN2013/084457 dated Jul. 16, 2014.
International Preliminary Report on Patentability for PCT Application No. PCT/CN2013/064457 dated Mar. 29, 2016.

* cited by examiner

DECOMPOSITION TECHNIQUES FOR MULTI-DIMENSIONAL DATA

CROSS-REFERENCE TO RELATED APPLICATION

This application is a national phase entry under 35 U.S.C. § 371 of International Application No. PCT/CN2013/084457, filed 27 Sep. 2013, the entire disclosure of which is incorporated herein by reference.

FIELD OF TECHNOLOGY

The present disclosure relates generally to processing data organized along multiple dimensions and, more particularly, to techniques for decomposing tensor representations of such data for subsequent completion and/or compression.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

The discovery of some sparse structure in matrix (i.e., two-dimensional) data is an integral part of many applications, such as those involving collaborative filtering or image inpainting. For matrices, the sparse structure is reflected by the matrix rank and finding sparse structure can be formulated as a matrix completion problem. For example, user-movie ratings generated by a movie rental service can be represented as an incomplete matrix. Missing elements of this incomplete matrix can be inferred based on a low-rank structure of the incomplete matrix. In this manner, the movie rental service can predict user movie preferences.

Existing matrix completion methods typically depend on Singular Value Decomposition (SVD). However, when data is represented in more than two dimensions (e.g., color images, image plus depth-map data, time-dependent user product ratings, etc.), SVD methods are not directly applicable. Further, known generalizations of SVD to more than two dimensions, such as Higher-Order SVD (HOSVD) and Canonical Polyadic Decomposition (CPD), are not strictly consistent with SVD and prevent the generalization of common algorithms.

SUMMARY

The techniques of the present disclosure can be used to efficiently and accurately manipulate multi-dimensional data such as, for example, color image data, three-dimensional (3D) image reconstruction data, or time-dependent item rating data. Generally speaking, this multi-dimensional data can be organized into a multi-dimensional array or tensor D. A multi-dimensional data manipulation engine of the present disclosure decomposes the tensor D into a product of a sparse core S and one or more unitary matrix multipliers $U_i$, so that the tensor D can be completed or compressed, for example. The sparse core S has fewer non-zero elements than the tensor D with the non-zero elements organized in a predictable manner (e.g., sorted in the order from elements containing the most structural information about the tensor D to elements containing the least structural information about the tensor D). Thus, the multi-dimensional data manipulation engine may truncate the sparse core S and/or the matrices $U_i$ and to construct a compressed version of the tensor D as a modified data structure D'. Further, the multi-dimensional data manipulation engine may optimize the sparse core S for data with missing elements (e.g., color image data missing one or more color elements or pixel values) such that the modified data structure D' completes missing elements in the tensor D.

One example embodiment of the techniques of this disclosure is a computer-implemented method for manipulating multi-dimensional data. The method, in which the steps or acts are executed by one or more processors, includes receiving original data organized along three or more dimensions. The original data describes a real-world object or activity. The method further includes generating a representation of the original data as a product of a plurality of multipliers including a sparse core and a plurality of unitary matrices, where the sparse core includes fewer non-zero values than a tensor representation of the original data. The method also includes generating modified data based on the original data using the multipliers, including compressing, or reconstructing missing elements in, the tensor representation of the original data, such that the modified data provides a description of the real-world object or activity that is less complete or more complete, respectively, relative to the original data.

Another example embodiment of the techniques of the present disclosure is another computer-implemented method for manipulating multi-dimensional data, in which the acts are executed by one or more processors. The method includes receiving original data organized along three or more dimensions to define a tensor D with rank n, where the original data describes a real-world object or activity. Further, the method includes executing a constrained Lp norm optimization to decompose the tensor D into a core S and a plurality of unitary matrix multipliers, where the core S includes fewer non-zero values than the tensor D, and generating modified data based on the original data using the core S and one or more of the unitary matrix multipliers. Generating the modified data includes compressing or completing the tensor D, such that the modified data provides a description of the real-world object or activity that is less complete or more complete, respectively, relative to the original data.

Still another example embodiment of the techniques of the present disclosure is a system including one or more processors, a first non-transitory computer-readable medium storing original data organized along three or more dimensions, and a second non-transitory computer-readable medium storing instructions. When executed by the one or more processors, the instructions cause the system to (i) generate a representation of the original data as a product of multipliers including a sparse core and a plurality of unitary matrices, where the sparse core includes fewer non-zero values than a tensor representation of the original data, and (ii) generate modified data based on the original data, such that the modified data is organized along the three or more dimensions, and where generating the modified data corresponds to completing or compressing the tensor representation of the original data using the multipliers.

Another example embodiment of the techniques of the present disclosure is a computer-based system for manipulating multi-dimensional data. The system includes a means for receiving original data descriptive of a real-world object or activity, which is organized along three or more dimensions. Further, the system includes a means for generating a representation of the original data as a product of a plurality of multipliers including a sparse core and a plurality of unitary matrices, where the sparse core includes fewer non-zero values than a tensor representation of the original data. Still further, the system includes a means for generating modified data based on the original data using the multipliers. The means for generating the modified data includes one or more of (i) a means for compressing the tensor representation of the original data to provide a description of the real-world object or activity that is less complete than the original data, and (ii) a means for reconstructing missing elements in the tensor representation of the original data to provide a description of the real-world object or activity that is more complete than the original data.

DETAILED DESCRIPTION

In general, the techniques of the present disclosure can be utilized to efficiently and accurately manipulate multi-dimensional data that describes a real-world object (e.g., a screen with pixels, camera moving in space and changing orientation relative to a scene) or a real-world activity (multiple users ranking multiple items over time). When the multi-dimensional data can be represented by a tensor D, elements missing from the tensor D are reconstructed to generate a more complete description of the object or activity or, conversely, the tensor D is compressed to generate a less complete description of the object or activity. Thus, for example, a digital image can be modified to estimate the missing colors or other attributes of some of the pixels, users' ratings of movies can be predicted based on these users' ratings of the other movies and the other users' rating of the same movies, a bitmap can be compressed for efficient transmission via a communication network, etc.

As discussed in more detail below, a multi-dimensional data manipulation engine decomposes the tensor D into a product of a sparse core S and one or more unitary matrix multipliers $U_i$. The sparse core S has fewer non-zero elements than the tensor D with elements organized in a predictable manner (e.g., sorted from elements containing the most structural information about the tensor D to elements containing the least structural information about the tensor D). As such, the multi-dimensional data manipulation engine may truncate the sparse core S and/or the matrices $U_i$ and construct a compressed version of the data, a modified tensor D'. Further, the multi-dimensional data manipulation engine may optimize the core S for reconstructing missing elements, such that a modified tensor D' includes elements missing from the tensor D.

To generate the sparse core S for a tensor D, the sparse core generator may implement a constrained optimization algorithm to minimize a relaxation of tensor rank, such as an L1 norm of a variable core X The constraints of the optimization may ensure advantageous properties of the core S and the matrices $U_i$, such as the unitarity of the matrices $U_i$, the form of the decomposition (e.g., $D=\Pi_i X U_i$), the dimensions of the core S, and the ordering of elements and/or row of the core S and the matrices $U_i$, respectively. Further, the optimization may be an iterative optimization, such as an augmented Lagrange method (ALM), to produce both the sparse core S and the one or more unitary matrices $U_i$. Subsequently to generating the core S and/or the matrices $U_i$, the low-rank generator (or another module operating in the same or a different system) may use the results of the decomposition to generate a modified tensor D'.

System Overview

Figure 1:
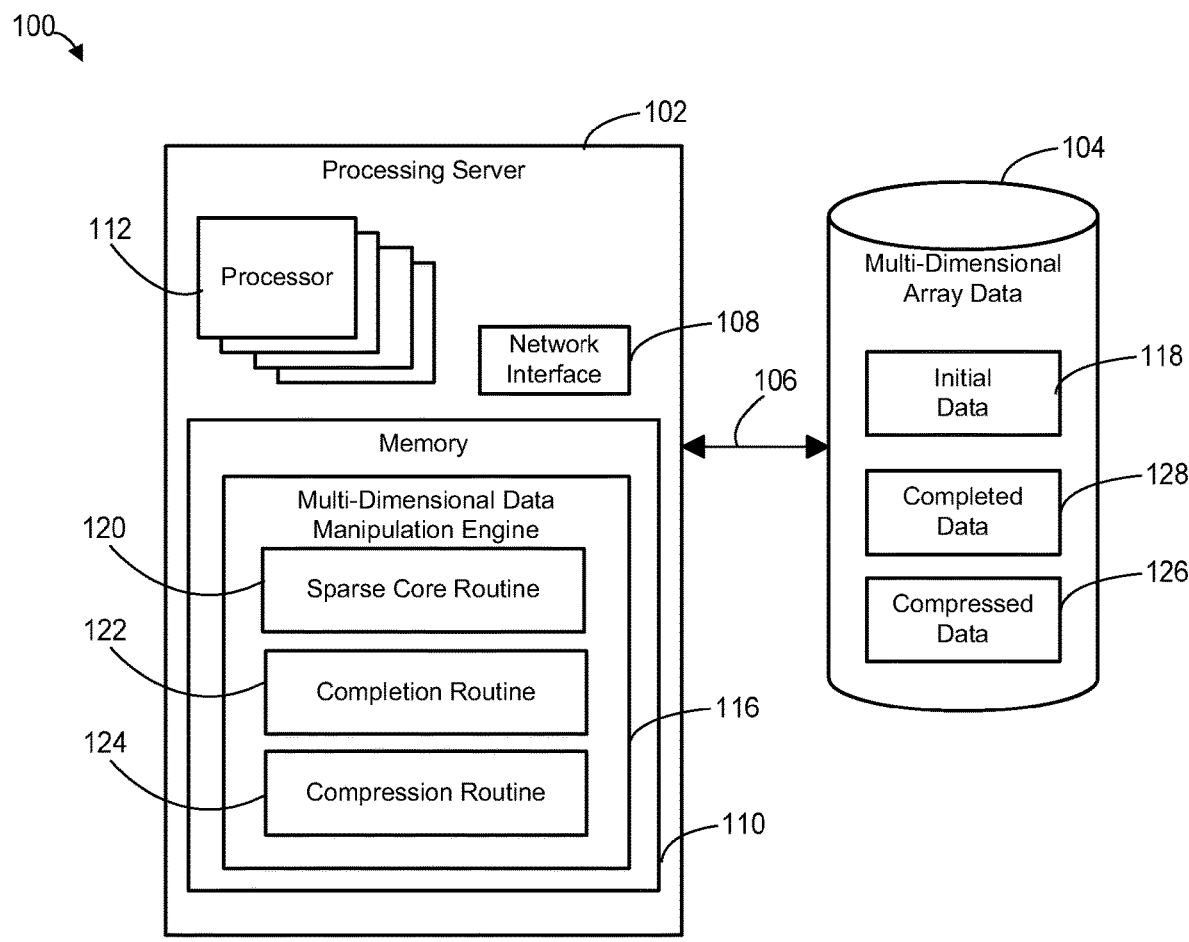
FIG. 1 illustrates an example computing environment in which a tensor representation of multi-dimensional data can be decomposed, and subsequently completed or compressed, according to the techniques of the present disclosure.

FIG. 1 illustrates an example computing environment 100 in which data, expressible in the form of a multi-dimensional array (e.g., a tensor), can be decomposed and subsequently completed or compressed. The computing environment 100 includes a processing server 102 communicatively coupled to a multi-dimensional array database 104. The processing server 102 can be communicatively coupled to the multi-dimensional array database 104 via a communication link 106, which can be part of any suitable wired and/or wireless network, including the Internet. The processing server 102 can transfer data to and from the multi-dimensional array database 104 via the communication link 106 and a network interface 108.

The processing server 102 may include various routines, in the form of computer-readable instructions, stored in a memory 110 and executable by one or more processors 112. The processors 112 generally can include any suitable number and type of processing units, in some cases including Graphics Processing Unit (GPUs). The memory 110 is tangible, non-transitory memory and may include any type of suitable memory modules, including random access memory (RAM), read-only memory (ROM), flash memory, etc.

In an implementation, the memory 110 stores instructions that implement a multi-dimensional data manipulation engine 116 that operates upon original data 118 in the multi-dimensional array database 104. The engine 116 may include: (i) a sparse core routine 120 configured to decompose part or all of the original data 118 into a sparse core and one or more multiplier matrices, as discussed with reference to FIG. 2; (ii) a completion routine 122 to reconstruct elements missing from the original data 118; and (iii) a compression routine 124 to compress portions (e.g., reduce a dimensionality or granularity) of the original data 118. The processing server 102 may store compressed data 126 or completed data 128 (collectively referred to herein as "modified" data) in the multi-dimensional array database 104.

By way of example, the original data 118 may include imagery data, user-product ratings data, three-dimensional model data, spectral analysis data, communication and radar data, web search data, handwriting analysis data, video data, etc. In general, the original data 118 may include any type of data expressible in a multi-dimensional array format.

More generally, the engine 116 can operate on any suitable device or a group of devices, in a distributed or non-distributed manner. The sparse core routine 120, for example, can operate separately and independently of the completion routine 122 or compression routine 124 (in some cases, on a different device or network). Further, the original data 118, the compressed data 126, and the completed data 128 need not be stored in the same database or on the same device or network. Still further, the original data 118 and/or the data 126 and 128 can be stored locally on a device that implements some or all of the components of the engine 116.

As another example, the engine 116 may be executed on a client device (not shown) on a GPU as part of a graphics or rendering "pipeline." For example, the client device may invoke the engine 116 when rendering a two-dimensional or three-dimensional digital model (e.g., a building, a map). The client device may compress or complete images as part of executing the graphic pipeline to generate imagery for a mapping application, a picture sharing service, a video game, or other application.

Sparse Unitary Decomposition (SUD)

In one embodiment of the techniques of this disclosure, the engine 116 implements an approach that can be referred to as "Sparse Unitary Decomposition" (SUD) to complete and/or compress a multi-dimensional array D. The SUD algorithm may represent a tensor D by the following decomposition:

$$D = \Pi_i S U_i \qquad (\text{Eq. 1})$$

where $D, S \in \mathbb{R}^{n1 \times n2 \times \ldots nk}$ for all indices i, and $U_i \in \mathbb{R}^{mi \times ni}$, S is referred to in this document as the sparse core corresponding to the tensor D. $\Pi_i$ loops over i-mode multiplications of respective matrices and tensors. As an example, for a 3-order tensor, it may be written in index form as $D_{ijk} = \Sigma_{abc} S_{abc} U_{ia} U_{jb} U_{kc}$.

In one implementation, the engine 116 generates the core S by solving a constrained Lp-norm or entropy optimization problem, such as:

$$S = \operatorname{argmin}_{X_1(U_j)_{j=1}^k} \|X\|_1 \qquad (\text{Eq. 2})$$

where for all indices i, $U_i^H U_i = U_i U_i^H = I$ (e.g., the matrices $U_i$ are unitary if $U_i$ are complex), $D = \Pi_i X U_i$, and $X \in \mathbb{R}^{n1 \times n2 \times \ldots nk}$, for example. In the case of real-valued matrices $U_i$, the above condition simplifies to $U_i^T U_i = U_i U_i^T = I$ (e.g., the matrices $U_i$ are orthogonal). The function "argmin," in an example implementation, returns values of a corresponding argument tensor X realizing the optimum, and the norm $\|\cdot\|_1$ is the L1-norm, as known in the industry.

When k=2 (e.g., the two-dimensional case), the above SUD decomposition is equivalent to a Singular Value Decomposition (SVD). However, when k≥3, $\|S\|_1$ (referred to herein as the "tensor trace norm") is a convex relaxation of tensor rank which is defined as the minimum number of non-zero rank-1 tensors required to build D (e.g., according to Eq. 1). This property of $\|S\|_1$ implies that SUD is not equivalent to SVD or any "unfolding" of a tensor, as the latter will only give a matrix rank. Further, in some implementations, S both (i) suppresses the effects of sparse outliers on a decomposed sparse structure and (ii) fills in unknown portions of D to simplify constraints of the optimization.

The SUD decomposition above (Eq. 1) can have the following advantageous properties: (i) S is "sparse" with the number of non-zeros components lower bounded by the tensor rank; and (ii) a truncated SUD (e.g., when $X \in \mathbb{R}^{r1 \times r2 \times \ldots rk}$) is optimal in that a truncated (e.g., compressed) tensor $D_r = \Pi_i S_r U_{r,i}$ may be constructed using the first r rows of each $U_{r,i}$ and the first r rows and columns of $S_r$, thus allowing predictable compression of the structure of D. Furthermore, the engine 116 may perform tensor completion in a similar manner to matrix completion via the definition and replacement of a tensor trace norm.

Figure 2:
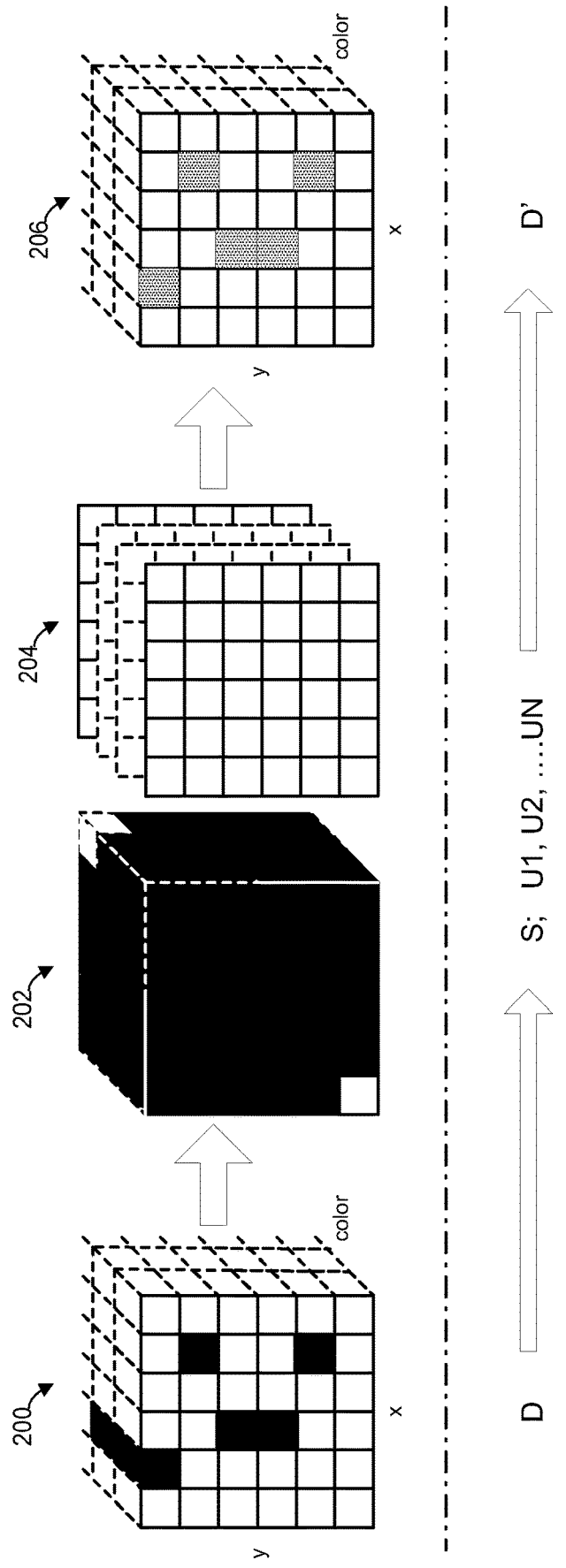
FIG. 2 schematically illustrates an example scenario in which data is completed using a technique implemented in the computing environment illustrated in FIG. 1.

For clarity, FIG. 2 illustrates an example scenario in which example original data 200 (or "D"), in the form of a two-dimensional color image, is decomposed and subsequently completed. The original data 200 in this example may be arranged along "x" and "y" position dimensions and a "color" dimension (e.g., expressing an RGB color of the image), and the original data 200 may include one or more missing elements illustrated by filled black boxes in FIG. 2. The missing elements may include missing color elements (e.g., along the "color" axis) or entire pixels, for example.

To complete the missing elements of the original data 200, the engine 116 may decompose the original data 200 into a sparse core 202 (or "S") and several matrix multipliers 204 (or $U_1, U_2, \ldots U_N$), as described above. The sparse core 202 may be diagonal, as illustrated by filled regions and unfilled corner regions in FIG. 2, and the matrix multipliers 204 may be two-dimensional. Further, as described above, the sparse core 202 and the matrix multipliers 204 may be predictably ordered, sorted or arranged.

Further, in the example scenario, the engine 116 may optimize or otherwise manipulate the decomposition to complete (e.g., predict, infer, recover, replace, or fill in) the missing elements of the original data 200. For example, the engine 116 may utilize a convex, or other suitable, optimization of the Lp norm of the sparse core 202 to infer and/or recover missing elements. In some cases, the engine 116 may optimize the decomposition and reconstruct a modified (in this case, completed) data set 206 based on the optimization, where the completed data set 206 includes recovered missing elements illustrated as partially filled boxes in FIG. 2. In other cases, the engine 116 may predict values for the missing elements directly from the decomposition (S and $U_1, U_2, \ldots U_N$) and execute a routine to replace the missing elements of the unprocessed data 200 with the predicted values, thus generating the completed data 206.

Although FIG. 2 illustrates an example scenario in which original data is completed, the techniques of the present disclosure also may be utilized to perform other operations on multi-dimensional data. In another example scenario, original data may be compressed via the decomposition into a sparse core and matrix multipliers. For example, a compressed data set may be constructed from the first r rows of each $U_i$ matrix and the first r rows and columns of the core S. The engine 116 may generate a compressed data set such that the compressed data set occupies a small amount of memory, includes only a minimal amount of information along one dimension, etc.

In some implementations, the engine 116 may use an augmented Lagrange method (ALM) algorithm to solve a decomposition problem, such as the decomposition of Eq. 2 formulated as a constrained L1 optimization. For example, the engine 116 may define an augmented Lagrange (L) as, $$L = \|X\|_1 + \frac{\mu}{2} \|D - \Pi_i X U_i\|_F^2 + \langle Y, D - \Pi_i X U_i \rangle \qquad (\text{Eq. 3})$$

or equivalently as, $$L = \|X\|_1 + \frac{\mu}{2} \left\|\Pi_i\left(D + \frac{Y}{\mu}\right)U_i^T - X\right\|_F^2 + const. \qquad (\text{Eq. 4})$$

where the $\|\cdot\|_F^2$ notation indicates a Frobenius norm. In some cases, the Frobenius norm reflects an assumption that noise within D follows a normal distribution, and the constrained minimization of L gives a convex relaxation of tensor rank, $\|X\|_1$, ensuring the properties of S discussed above.

In some implementations, the ALM algorithm may be an iterative algorithm (e.g., a penalty method) with update rules as follows:

$$X^{k+1} = \text{Shrink}_{1/\mu}\left(\Pi_i\left(D + \frac{Y^k}{\mu}\right)(U_i^k)^T\right); \quad \text{(Eq. 5) d}$$

$$U_j^{k+1} = BA^T; \quad \text{(Eq. 6) d}$$

$$Y^{k+1} = Y^k + \mu(D - \Pi_i X^{k+1} U_i^{k+1}); \text{ and} \quad \text{(Eq. 7) d}$$

$$\mu^* = \rho, \quad \text{(Eq. 8)}$$

where, $$\text{Shrink}_\tau(X_{ij}) = \begin{cases} \text{sgn}(X_{ij})(|X_{ij}| - \tau), & X_{ij} > \tau \\ 0, & |X_{ij}| \le \tau \end{cases}, \quad \text{(Eq. 9) d}$$

and $$ASB^T = \left\{\text{fold}_j\left(D + \frac{Y^k}{\mu}\right), \text{fold}_j(\Pi_{i,i \ne j} X^{k+1} U_i)\right\}.$$

Although Eq. 6 includes a k+1 index for $U_j$, the index of the update equation for $U_j$ may be k+1 or k depending on whether the ALM algorithm uses a Jacobi or Gauss-Seidel scheme.

Although an example ALM algorithm is included above for clarity, any suitable algorithm(s) or method(s) may be used to solve for S and/or compress or complete multi-dimensional arrays. Further, the functionality of the engine 116 and included algorithms (e.g., ALM) may be split between multiple different algorithms and/or may be executed on multiple different processors or GPUs.

In some implementations, the engine 116 may limit the space used by the optimization variables of Eq. 3 or another suitable optimization. For example, the engine 116 may limit the space of the optimization variable X when the data D is of large dimension, thus reducing computational cost. In one implementation, a space limited optimization would yield S as the solution to:

$$\min_{X,\{U_i\}_{i=1}^k} \|X\|_p + \frac{\gamma}{2} \|D - \Pi_i X U_i\|_F^2 \quad \text{s.t. } \forall i, \quad \text{(Eq. 10)}$$
$$U_i^T U_i = I, p < 2,$$

$$\max_{X,\{U_i\}_{i=1}^k} \|X\|_p + \frac{\gamma}{2} \|D - \Pi_i X U_i\|_F^2 \quad \text{s.t. } \forall i, \quad \text{(Eq. 11)}$$
$$U_i^T U_i = I, p > 2,$$

in the limited space $r_1 \times r_2 \times \ldots r_k$ where $X \in \mathbb{R}^{r_1 \times r_2 \times \ldots r_k}$.

Moreover, although the L1 norm is discussed above, the engine 116 may use a penalization scheme similar to Eq. 3 with any other suitable convex or non-convex norm, such as an Lp norm. For example, the engine 116 may generate a sparse core S (fulfilling Eq. 1) where S is a solution to:

$$\min_{X,\{U_i\}_{i=1}^k \|X\|_p} \text{ s.t. } U_i^T U_i = U_i U_i^T = I \;\forall i, D = \Pi_i X U_i, \quad \text{(Eq. 12)}$$
$$p < 2,$$

$$\max_{X,\{U_i\}_{i=1}^k \|X\|_p} \text{ s.t. } U_i^T U_i = U_i U_i^T = I \;\forall i, D = \Pi_i X U_i, \quad \text{(Eq. 13)}$$
$$p > 2$$

where $X \in \mathbb{R}$. In such a case, the optimum Lp-norm of S, $\|S\|_p$, generates the lowest strong orthogonal rank representation of a tensor as p→0. This property of the Lp-norm of S is shown by taking the following limit:

$$\lim_{p \to 0} \|X^*(p)\|_p^p = \|X\|_p = \|S\|_0 = \text{rank}(S) = o\text{rank}(D), \quad \text{(Eq. 14)}$$

where $X^*(p)$ is the optimum of the Lp-norm optimization for D, and "orank" represents strong orthogonal rank (e.g., the minimum number of non-zeros in X s.t. $D = \Pi_i X U_i$, where $U_i$ are unitary).

In general, tensor rank is ill-defined. However, with the above generalization of SUD to the Lp-norm, tensor strong orthogonal rank is well-defined and similar to the definition of rank for matrices. As such, the engine 116 may utilize such SUD methods to discover and measure (with the norm of S) sparse structure in a tensor in a uniform manner.

S as an Upper Bound

In many cases, the sparse core S maintains full "expressivity" of the data D such that the core S is a max (upper) bound for all unfolding of the tensor D. As opposed to any one particular unfolding method, such as those known in the industry, the SUD decomposition of the tensor D (and thus the engine 116) need not be restricted to certain types or structures of data. For example, the engine 116 may generate a sparse core S for the tensor D with a high tensor order and small dimensions, such as a 2×2×2×2 tensor, which is a type of data structure whose sparse structure cannot be captured by any unfolding of the data along a single index.

Further, a norm of the sparse core S may be an upper bound for all, not necessary single-index, tensor unfoldings. Accordingly, the engine 116 may avoid costly selection and weighting of tensor unfoldings. For example, the cost of generating the sparse core S may be similar to that of minimizing $$\frac{1}{k}\sum_{i=2}^k \|\text{unfold}_i(D)\|_p$$

(a sum over all unfolding of D) which is more tractable than minimizing the norm of $2^{k-1} - 2$ unfolding.

To show that a norm of S may be a max (upper) bound for all unfolding of D, the sparse core S, generated by the engine 116, may be rewritten in terms of a Kronecker product:

$$\min\|X\|_p \text{ s.t. } \text{vec}(D) = (\hat{\times}_i U_i)\text{vec}(X), \quad \text{(Eq. 15)}$$

where $U_i$ is unitary and p<2, and $$\max\|X\|_p \text{ s.t. } \text{vec}(D) = (\hat{\times}_i U_i)\text{vec}(X), \quad \text{(Eq. 16)}$$

where p>2.

Noting that SVD may be written as:

$$\min\|X\|_p \text{ s.t. } \text{vec}(D) = (V\hat{\times}U)\text{vec}(X), p<2, \quad \text{(Eq. 17)}$$

$$\max\|X\|_p \text{ s.t. } \text{vec}(D) = (V\hat{\times}U)\text{vec}(X), p>2 \quad \text{(Eq. 18)}$$

where U and V are unitary, the expressions of Eq. 15 and Eq. 16 may be transformed into SVD form by substituting $U_i$ for U. Since the Kronecker product of two unitary matrices is still unitary, SUD (with the general Lp norm) is an SVD of all unfolded D's with the additional constraint that U and V can be expressed as a Kronecker product of matrices.

Completion and Compression with SUD

Figure 3:
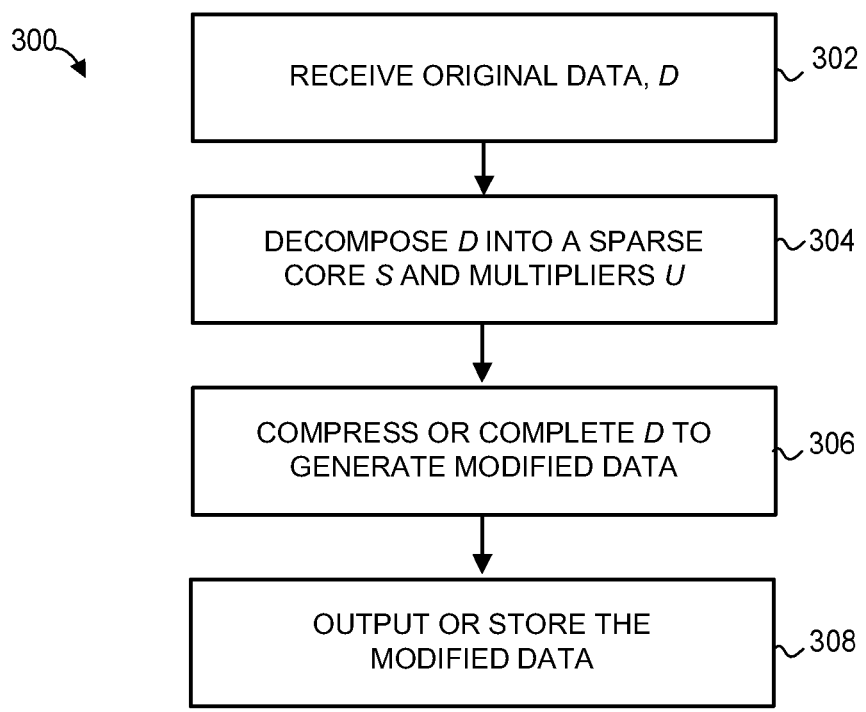
FIG. 3 is a flow diagram of an example method for completing or compressing data, which can be implemented in the computing environment illustrated in FIG. 1.

FIG. 3 is a flow diagram of an example method 300 for completing or compressing data based on a decomposition. The method 300 may be implemented by the processing server 102, for example.

At block 302, original data D is received. In some implementations, the processing server 102 may actively query the multi-dimensional array database 104 and receive original data D in response to the query. For example, the processing server 102 may retrieve, or query, the original data D during a process of rendering imagery for a digital mapping application. In another example, the processing server 102 may retrieve original data D to generate one or more movie suggestions for a user of a movie rental or rating website. In general, the processing server 102 may query and receive original, or unprocessed, data D at any suitable time or in response to any triggering event.

Next (block 304), the original data D is decomposed into a sparse core, S, and one or more matrix multipliers $U_i$. In some implementations, the engine 116 may decompose data D via SUD decomposition, as described above. For example, the engine 116 may execute a routine, such as the sparse core routine 120, to optimize a convex relaxation of tensor rank (e.g., an L1 norm) and generate the sparse core S. Although specific examples of the SUD routine are given above (e.g., using an ALM algorithm), it will be understood that any suitable decomposition may be used to generate a sparse core, where the sparse core is sparse, diagonal, and may be predictably ordered.

At block 306, the original data is completed or compressed based on the decomposition into a sparse core, S, and one or more matrix multipliers $U_i$. For example, the engine 116 may execute the compression routine 124 to generate a compressed version of the original data. Alternatively, the engine 116 may execute the completion routine 122 to complete missing elements of the original data. In some implementations, data may always be either compressed or completed based on a utilization of the processing server 102 for a dedicated task (e.g., generating map tiles, user suggestions, etc.). In other implementations, the processing server 102 may either complete or compress data based on user input received via a remote computing device or user interface.

At block 308, the completed or compressed data ("modified" data) is output or stored. In some implementations, the processing server 102 may store modified data in the database from which the original data was queried. However, the processing server 102 may store the modified data in any suitable database or may output the modified data to a particular device or for a particular purpose. For example, the processing server 102 may output user suggestions to an remote computing device operated by the user, such as a smartphone, tablet computer, etc.

Additional Considerations

The following additional considerations apply to the foregoing discussion. Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter of the present disclosure.

Additionally, certain embodiments are described herein as including logic or a number of components, modules, or mechanisms. Modules may constitute either software modules (e.g., code stored on a machine-readable medium) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

A hardware module may be implemented electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term hardware should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware and software modules can provide information to, and receive information from, other hardware and/or software modules. Accordingly, the described hardware modules may be regarded as being communicatively coupled. Where multiple of such hardware or software modules exist contemporaneously, communications may be achieved through signal transmission (e.g., over appropriate circuits and buses) that connect the hardware or software modules. In embodiments in which multiple hardware modules or software are configured or instantiated at different times, communications between such hardware or software modules may be achieved, for example, through the storage and retrieval of information in memory structures to which the multiple hardware or software modules have access. For example, one hardware or software module may perform an operation and store the output of that operation in a memory device to which it is communicatively coupled. A further hardware or software module may then, at a later time, access the memory device to retrieve and process the stored output. Hardware and software modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods or routines described herein may be at least partially processor-implemented. For example, at least some of the operations of a method may be performed by one or processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The one or more processors may also operate to support performance of the relevant operations in a "cloud computing" environment or as a SaaS. For example, as indicated above, at least some of the operations may be performed by a group of computers (as examples of machines including processors), these operations being accessible via a network (e.g., the Internet) and via one or more appropriate interfaces (e.g., APIs).

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" or a "routine" is a self-consistent sequence of operations or similar processing leading to a desired result. In this context, algorithms, routines and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the description. This description should be read to include one or at least one and the singular also includes the plural unless it is obvious that it is meant otherwise.

Upon reading this disclosure, those of skill in the art will appreciate still additional alternative structural and functional designs for completing or compressing multi-dimensional data through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A computer-implemented method for manipulating multi-dimensional data, the method comprising:
receiving, by one or more processors, data organized along three or more dimensions, wherein the data represents a real-world object or activity;
generating, by the one or more processors, a representation of the data as a product of a plurality of multipliers including a sparse core and a plurality of unitary matrices, wherein the sparse core includes fewer non-zero values than a tensor representation of the data; and
generating, by the one or more processors, modified data based on the data using the plurality of multipliers, including compressing, or reconstructing missing elements in, the tensor representation of the data, wherein the modified data provides a representation of the real-world object or activity that is less complete or more complete, respectively, relative to the data;
wherein generating the modified data includes compression and completion of the data based on a utilization of the one or more processors for a dedicated task, wherein the compression of the data is constructed using first rows of each of the plurality of unitary matrices and first rows and columns of the sparse core, and wherein the non-zero values of the sparse core are provided in order from non-zero values having most information about the tensor representation of the data to non-zero values having least information about the tensor representation of the data.

2. The method of claim 1, wherein the data represents pixels of a digital image, and wherein the dimensions of the data include (i) position along a horizontal axis, (ii) position along a vertical axis, and (iii) color.

3. The method of claim 2, wherein generating the modified data includes reconstructing, by the one or more processors, respective colors of pixels of the digital image missing from the data to complete the tensor representation of the data.

4. The method of claim 1, wherein the data represents collaborative filtering data organized along the three or more dimensions including (i) user identification, (ii) item identification, and (iii) item rating.

5. The method of claim 1, wherein the data represents a Structure from Motion (SFM) reconstruction of a physical object, and wherein the data is organized along the three or more dimensions including at least several of (i) x-coordinate of a camera, (ii) y-coordinate of the camera, (iii) z-coordinate of the camera, (iv) pitch of the camera, (v) yaw the camera, and (vi) roll of the camera.

6. The method of claim 1, wherein non-zero values in the sparse core are arranged according to an ascending or descending order.

7. The method of claim 6, wherein generating the modified data includes applying, by the one or more processors, some but not all of the non-zero values of the sparse core based on an ordering of the non-zero values to compress the tensor representation of the data.

8. The method of claim 1, wherein generating the representation of the data as the product of multipliers includes executing, by the one or more processors, an iterative constrained optimization algorithm to determine values of the sparse core that produce a lowest Lp norm of the sparse core.

9. The method of claim 8, wherein the lowest Lp norm is an approximation to a strong orthogonal rank.

10. A computer-implemented method for manipulating multi-dimensional data, the method comprising:
receiving, by one or more processors, data organized along three or more dimensions to define a tensor D with rank n, wherein the data represents a real-world object or activity;
executing, by the one or more processors, a constrained Lp norm optimization to decompose the tensor D into a core S and a plurality of unitary matrix multipliers, wherein the core S includes fewer non-zero values than the tensor D; and
generating, by the one or more processors, modified data based on the data using the core S and one or more of the plurality of unitary matrix multipliers, including compressing and completing the tensor D, wherein the modified data provides a description of the real-world object or activity that is less complete or more complete, respectively, relative to the data;
wherein generating the modified data includes compression or completion of the data based on a utilization of the one or more processors for a dedicated task,
wherein the compression of the data is constructed using first rows of each of the plurality of unitary matrices and first rows and columns of the core S, and
wherein the non-zero values of the core S are provided in order from non-zero values having most information about the tensor D to non-zero values having least information about the tensor D.

11. The method of claim 10, wherein the data represents pixels of a digital image, and wherein the dimensions of the data include (i) position along a horizontal axis, (ii) position along a vertical axis, and (iii) color.

12. The method of claim 11, wherein generating the modified data includes determining, by the one or more processors, respective colors of pixels of the digital image missing from the data to complete the tensor representation of the data.

13. The method of claim 10, wherein the data is product rating data organized along the three or more dimensions including (i) buyer identification, (ii) product identification, and (iii) product rating.

14. The method of claim 10, wherein the core S represents a sparse structure of the tensor D.

15. The method of claim 14, wherein a norm of the core S is a bound for all tensor unfoldings of the tensor D.

16. The method of claim 14, wherein the core S is a diagonal tensor, with non-zero values along a diagonal being ordered.

17. The method of claim 10, wherein executing constrained Lp norm optimization includes executing constrained L1 norm optimization.

18. A system comprising:
one or more processors;
a first non-transitory computer-readable medium storing thereon data organized along three or more dimensions;
a second non-transitory computer-readable medium storing thereon instructions that, when executed by the one or more processors, cause the system to:
generate a representation of the data as a product of multipliers including a sparse core and a plurality of unitary matrices, wherein the sparse core includes fewer non-zero values than a tensor representation of the data, and
generate modified data based on the data, wherein the modified data is organized along the three or more dimensions, and wherein generating the modified data corresponds to completing or compressing the tensor representation of the data using the multipliers;
wherein the system is configured to generate the modified data by compression and completion of the data based on a utilization of the one or more processors for a dedicated task,
wherein the compression of the data is constructed using first rows of each of the plurality of unitary matrices and first rows and columns of the sparse core, and
wherein the non-zero values of the sparse core are provided in order from non-zero values having most information about the tensor representation of the data to non-zero values having least information about the tensor representation of the data.

19. The system of claim 18, wherein the data represents pixels of a digital image, and wherein the dimensions of the data include (i) position along a horizontal axis, (ii) position along a vertical axis, and (iii) color.

20. The system of claim 19, wherein to generate the modified data, the instructions cause the system to determine respective colors of pixels of the digital image missing from the data to complete the tensor representation of the data.

\* \* \* \* \*